United States Patent
Park et al.

(10) Patent No.: US 9,543,971 B2
(45) Date of Patent: Jan. 10, 2017

(54) SPIN MODULATOR AND SPIN-TRANSFER TORQUE OSCILLATORS HAVING PHASE TUNING MEANS AND MODULATION METHOD THEREOF

(71) Applicant: KOREA ADVANCED INSTITUTE OF SCIENCE AND TECHNOLOGY, Daejeon (KR)

(72) Inventors: ChulSoon Park, Daejeon (KR); Inn Yeal Oh, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/647,022

(22) PCT Filed: Oct. 15, 2013

(86) PCT No.: PCT/KR2013/009181
§ 371 (c)(1),
(2) Date: May 22, 2015

(87) PCT Pub. No.: WO2014/084496
PCT Pub. Date: Jun. 5, 2014

(65) Prior Publication Data
US 2015/0303931 A1    Oct. 22, 2015

(30) Foreign Application Priority Data
Nov. 27, 2012  (KR) .......................... 10-2012-0134979

(51) Int. Cl.
*H03L 7/24*    (2006.01)
*H03B 15/00*   (2006.01)
(Continued)

(52) U.S. Cl.
CPC ............... *H03L 7/24* (2013.01); *H03B 15/006* (2013.01); *H03C 3/00* (2013.01); *H03L 1/00* (2013.01)

(58) Field of Classification Search
CPC ............ H03L 7/24; H03L 1/00; H03B 15/006; H03C 3/00
(Continued)

(56) References Cited

U.S. PATENT DOCUMENTS 6,188,255 B1 * 2/2001 Mann ........................ G06F 1/08
                                                    327/113
7,635,903 B2    12/2009 Mancoff et al.
(Continued)

FOREIGN PATENT DOCUMENTS

KR    10-2011-0036205 A    4/2011
KR       10-1284687 B1    7/2013

OTHER PUBLICATIONS

Yan Zhou et al., "Capacitance Enhanced Synchronization of Pairs of Spin-Transfer Oscillators", IEEE Transactions on Magnetice, Jun. 2009, pp. 2421-2423, vol. 45, No. 6.

*Primary Examiner* — Richard Tan
(74) *Attorney, Agent, or Firm* — Rabin & Berdo, P.C.

(57) ABSTRACT

A spin modulator with phase tuning means which comprises, a spin array which consists of m×n matrix spin-transfer torque oscillators, a selection control means which selectively operates the spin-transfer torque oscillators according to an operation condition of the spin array, and a phase tuning array which includes m×n matrix phase tuning means, wherein the m×n matrix phase tuning means tune a phase synchronization operation of the spin-transfer torque oscillators according to the operation condition.

5 Claims, 6 Drawing Sheets

(51) Int. Cl.
*H03C 3/00* (2006.01)
*H03L 1/00* (2006.01)

(58) Field of Classification Search
USPC ............... 331/1 R, 2, 5, 16, 46, 49, 86, 176
See application file for complete search history.

(56) References Cited

U.S. PATENT DOCUMENTS

| | | |
|---|---|---|
| 8,049,567 B2 | 11/2011 | Persson et al. |
| 2007/0236105 A1 | 10/2007 | Mancoff et al. |
| 2009/0115541 A1 | 5/2009 | Persson et al. |

* cited by examiner ( m x n spin array with amplitude modulation)

(m x n spin array with frequency modulation)

SPIN MODULATOR AND SPIN-TRANSFER TORQUE OSCILLATORS HAVING PHASE TUNING MEANS AND MODULATION METHOD THEREOF

TECHNICAL FIELD

The present invention relates to a spin modulator with a phase tuning means, and more specifically, to a spin modulator that modulates data signals using a carrier signal that is adjusted by a variable capacitor and a lookup table (hereinafter, "LUT") which are connected to a spin-transfer torque oscillator in order to optimize the output power and the phase noise of the spin-transfer torque oscillator.

BACKGROUND ART

The bandwidth of conventional VCOs is so narrow that multiband communications need a plurality of VCOs that take long settling time to attain the required frequency after power-on.

A spin-transfer torque oscillator (hereinafter, "spin oscillator") which uses spin-transfer torque phenomena can be used for multiband communication apparatus by virtue of the frequency controllability by changing the amount of applied current of a single spin oscillator. Due to the short settling time of the spin oscillator, the spin oscillator can achieve high speed data transmission rate of 50 Mbps for FSK modulation or 500 Mbps for ASK modulation in the case of a single symbol modulation.

A spin oscillator can be integrated on a silicon substrate by the nanometer scale structure so that it has advantages of small size and mass production. However, so far, the spin oscillator cannot replace VCOs and is not to be used as a communication component because the output power of the spin oscillator is very low level of less than −40 dBm and its phase noise is high. The output power of less than −40 dBm limits the transmission distance and the required signal to noise ratio (SNR) cannot be achieved due to high phase noise characteristics.

Spin oscillators which are fabricated using nanoscale process show some problems of high fluctuation range of performance due to process variations and high fluctuation of the output power due to external force like magnetic field and the operational condition like the amount of applied current. Non-patent reference 1 discloses the simulation result which synchronizes two spin oscillators using a variable capacitor.

NON-PATENT REFERENCES (Non-patent reference 1) Yan Zhou, et al., "Capacitance enhanced synchronization of pairs of spin-transfer oscillators." IEEE Trans. on Magnetics, Vol. 45, No. 6, pp. 2421-2423, June 2009.

DISCLOSURE

Technical Problem

In order to solve the above problems, the present invention provides a spin modulator with a phase tuning means for tuning a fluctuation of performance of a spin oscillator occurred in the fabrication process. The phase tuning means adjusts the required spin oscillator performance by employing a variable capacitor which is connected to a spin oscillator and a LUT which controls a variable capacitor. That modulates the input data by optimizing both the output power and the phase noise characteristics which are used for a carrier signal.

Technical Solution

According to the present invention in order to solve the above problems, a spin modulator comprises a spin array which consists of m×n matrix spin oscillators where m and n are integer greater than or equal to 1; a selection control means for operating the spin oscillators selectively according to operation conditions; and a phase tuning array that includes the m×n phase control means for the control of phase synchronization operation of the spin oscillators according to the operation conditions.

In accordance with an aspect of the present invention, a modulation method of a spin modulator comprises, the steps of: selecting at least one modulation method from the group of a amplitude modulation, a frequency modulation, and a phase modulation, dividing a spin array into predetermined blocks of spin oscillators according to the selection of a modulation method, applying the control values selected from a LUT to a phase control means of the spin oscillator block, and operating the spin modulator by selecting the spin oscillator block and applying electric power.

In accordance with an aspect of the present invention, spin oscillators comprises the spin array which consists of m×n matrix spin oscillators, where m and n are integer greater than or equal to 1 and the phase control array which consists of m×n phase control means for the control of phase synchronization operation of the spin oscillators according to the operation conditions.

Advantageous Effects

The present invention applies the tuning values stored in a LUT to each variable capacitor of each spin oscillator selectively. That operates a spin oscillator for the optimum power and the phase noise characteristics which generate output signals of the modulation of input data.

The present invention can embody a system on chip (SOC) by integrating spin oscillator using CMOS nanoscale process and provide it at low cost and mass production.

Gaga bit data transmission, multiband frequency transmission and reception can be implanted by a multi-symbol amplitude modulation, a multi-symbol frequency modulation, or a multi-symbol phase modulation according to the present invention.

The present invention can make a very small telecommunication micro-module with low power consumption by integrating spin oscillator and spin modulator of nanosize unit.

The present invention can overcome the long settling time of VCOs. The long settling time of the VCOs limits the data transmission speed as a few Kbps. The spin modulator according to the present invention can transmit data as fast as Giga bit using multi-symbol modulation method.

DESCRIPTION OF DRAWINGS

FIG. 10(a) shows a variable serial capacitor and FIG. 10(b) shows a variable parallel capacitor.

MODE OF THE PRESENT INVENTION

Hereinafter, exemplary embodiments of the present invention will be described with drawings. In each drawing of the present invention, a size may be enlarged or reduced than an actual size to clarify the invention, and well known elements are omitted to emphasize a structural feature of the present invention.

Figure 2:
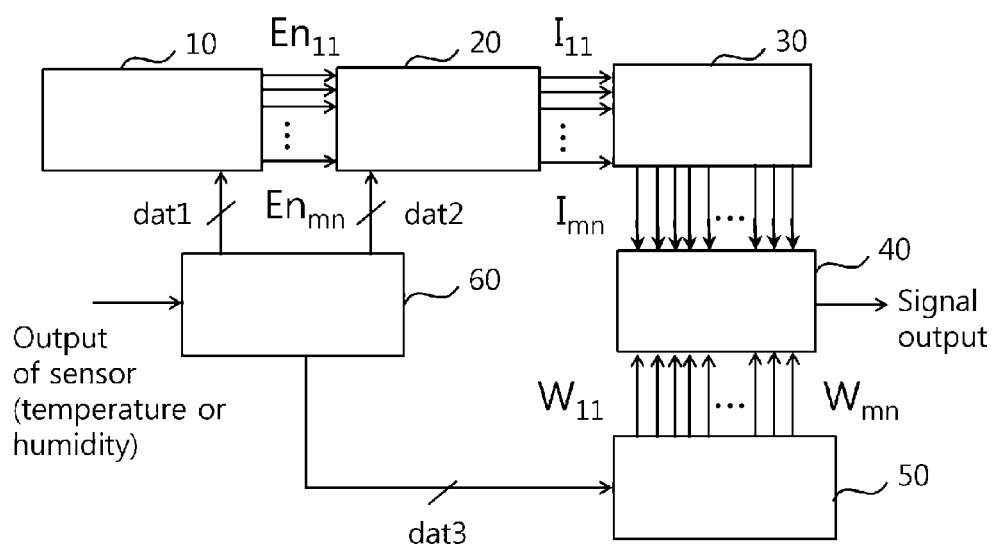
FIG. 2 illustrates a block diagram of a spin oscillator and a spin modulator having phase tuning means according to the present invention.

FIG. 2 as a block diagram of a spin modulator according to the present invention includes a selection control means 10, a power supply means 20, a spin array 30, a phase tuning array 40, a lookup table (LUT) which tunes a variable capacitor 50, and a control unit 60.

The spin array 30 is designed as an m×n matrix of spin oscillators, where m and n are integer greater than or equal to 1. Each spin oscillator generates oscillation signals by applying direct current and the frequency of each spin oscillator can be varied with the magnitude of current or of the external magnetic field.

Figure 4:
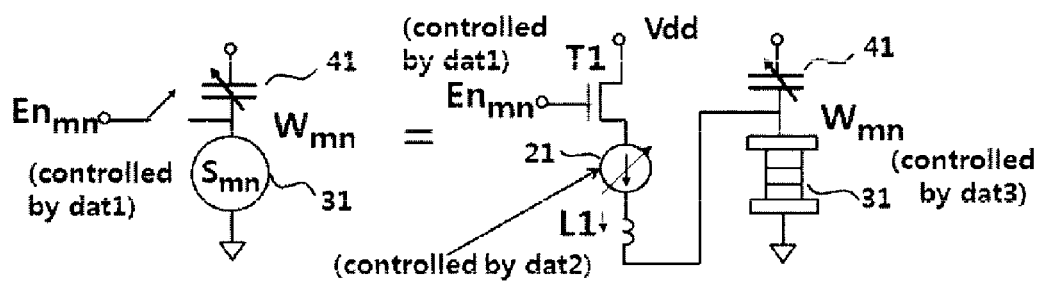
FIG. 4 illustrates a circuit diagram of the detailed configuration which includes a spin oscillator, a variable capacitor, and a variable current source described in FIG. 3.

The power supply means 20 provides the power ($I_{11}, I_{12}, \ldots, I_{mn}$) to the spin array 30 by the selection control means 10, where the power is direct current or direct voltage. The power supply means 20 as described in FIG. 4 is a variable current source 21 which supplies the different amount of direct currents to each spin oscillator for the generation of different frequencies.

The phase tuning array 40 forms m×n matrix like the spin array. Here the phase tuning means which performs the phase synchronization operation of the spin oscillator makes pairs of 1:1 correspondence with each spin oscillator of the spin array 30. The phase tuning means as described in FIG. 2 and FIG. 5 can be implanted using a variable capacitor. That is also implanted by the connection of serial, parallel or the combination of both of a variable capacitor or an inductor. The variable capacitor 41 is implanted using a MOS transistor or a PN diode which varies its capacitance by applying voltage. A MOS transistor varies its capacitance with varying the gate voltage. A PN diode varies its capacitance with varying the depletion region between anode and cathode by applying forward or reverse bias voltage.

Figure 10:
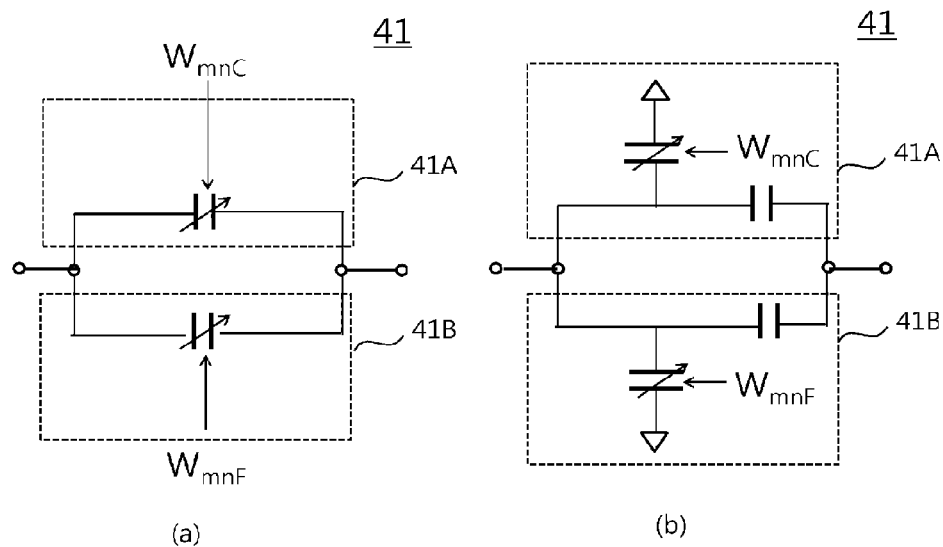
FIG. 10 shows an embodiment of the variable capacitors according to the present invention.

For example, a variable capacitor 41 as described in FIG. 10(a) and FIG. 10(b) includes a coarse capacitor unit 41A and a fine capacitor unit 41B. The coarse capacitor unit 41A and the fine capacitor unit 41B as described in Table 2 allocate the optimum capacitor value for the operation condition of the spin oscillator by applying the third control signal (dat3). In a case of amplitude modulation operation of the spin oscillator block array as described in FIG. 6, for example, some among the first, the second and the third spin oscillator block are operated while the other is not operated according to the operation of the modulation. In the operating spin oscillator block, the operation condition can be varied by a LUT base which is predetermined according to the operation conditions. Referring the table 2, the optimum spin oscillation signal can be obtained by selecting the optimum value of the predetermined operation condition stored in a LUT 50 which is the third control signal (dat3). The third control signal value of control unit 60 is determined according to the operation conditions. The predetermined tuning value can produce not only the fast response and accurate modulation signal generation according to each operation condition but also the fast compensation operation with varying operation conditions.

The selection control means 10 operates spin oscillators selectively inside the spin array 30. A decoder 11 or a de-multiplexer as described in FIG. 3 can be used for the selection control means.

The LUT 50 is a table which stored the tuning values for a phase tuning means and varies the phase tuning means by selecting the optimum value according to the manufacturing condition or the operation condition. In the case of PN diode application as the phase tuning means, the capacitance values or the proportional voltage values with the capacitance, which is varied by applying voltage, are listed in a table and the table is stored in LUT 50. Each spin oscillator with different frequencies makes phase synchronization by looking up and selecting the required capacitance value in the LUT and applying the voltage to the corresponding PN diode.

The control unit 60 outputs the first control signal (dat1), the second control signal (dat2) and the third control signal (dat3) according to the output signals of amplitude shift keying (ASK), frequency shift keying (FSK), or phase shift keying (PSK). The first control signal (dat1) controls the selection control means 10, and the second control signal (dat2) controls the power supply means 20, and the third control signal (dat3) controls the LUT. The control unit 60 might include a LUT controller in the LUT 50 additionally for looking up the optimum condition according to the operation condition.

The selection control means 10 operates selectively the spin array 30 entirely or partly with applying the first control signal (dat1). The power supply means 20 control the magnitude of current of the spin array 30 with applying the second control signal (dat2). The amplitude modulation, the frequency modulation, or the phase modulation can be performed and the selection of two among them can be performed with complexity modulation by controlling the first control signal (dat1) and the second signal (dat2) together, or controlling the first control signal with fixing of the second signal (dat2). The modulation method is described in FIG. 6-8.

A phase synchronization method according to the present invention outputs the same phase or the same frequency signals as the result of phase synchronization due to mutual influence each other between neighbor spin oscillators. In the case of the different phase or the different frequency signal output, the output signals with different phases lead to synchronization as a single high power signal by tuning the impedance of each phase tuning means for the synchronization with the same phase. The phase synchronization brings the effect of increasing the output power and decreasing the phase noise relatively.

The LUT 50 stores tuning values which are optimized for the operation condition. To get the maximum output power according to the characteristics of a spin oscillator, each tuning value applies to each phase tuning means, respectively. The LUT 50 is used to obtain the maximum output power signal by operating the optimum condition of the phase synchronization of a spin array under any circumstance.

Spin oscillators might generate different signals in output power levels and phases according to magnetic field, temperature, and humidity. The difference in output power level and phase might be caused by frequency band, output power level, and modulation method such as ASK, FSK, and PSK. The optimum tuning value that is inputted to a variable capacitor according to the required operation condition might have analog value in the LUT 50. That can generate the optimum oscillation signals by tuning the capacitance of each spin array 30. The tuning value is applied to a variable capacitor to implant the optimum characteristics of each spin oscillator followed by analyzing oscillation frequency characteristics, phase synchronization characteristics, and output power characteristics.

TABLE 1

| Operation condition | W11 | W12 | W13 | W14 | W21 | W22 | W23 | W24 |
|---|---|---|---|---|---|---|---|---|
| AM | 1.03 | 0.98 | 0.99 | 1.05 | 0.88 | 0.97 | 1.06 | 1.07 |
| FM | 1.06 | 1.03 | 0.97 | 1.06 | 1.06 | 1.05 | 1.05 | 1.05 |
| PM | 0.99 | 1 | 1.03 | 1.03 | 1.05 | 1.05 | 1.03 | 1 |
| Freq. band 1 | 1.07 | 1.07 | 1 | 1.06 | 1 | 1 | 1 | 0.99 |
| Freq. band 2 | 1.05 | 1.06 | 1.02 | 1.03 | 1.07 | 1 | 1.03 | 1.05 |
| Freq. band 3 | 1.03 | 1.07 | 0.97 | 1 | 1.06 | 0.98 | 1.02 | 1.05 |
| Output power level 1 | 1.07 | 1 | 0.99 | 1.07 | 0.99 | 1.07 | 1.02 | 1 |
| Output power level 2 | 1.03 | 0.98 | 1.02 | 0.97 | 1.02 | 1 | 1.02 | 1.05 |
| Output power level 3 | 1.07 | 1.03 | 1.07 | 1.03 | 0.97 | 1.05 | 1.04 | 0.99 |
| Magnetic field condition 1 | 1.02 | 0.98 | 1 | 0.99 | 1.06 | 1.07 | 0.98 | 1.02 |
| Magnetic field condition 2 | 0.99 | 0.99 | 1.05 | 1 | 1.05 | 0.98 | 1.03 | 1 |
| Magnetic field condition 3 | 1.02 | 1 | 1.07 | 1.03 | 1.03 | 1 | 1.02 | 1.08 |
| Humidity 1 | 0.99 | 1.07 | 1.02 | 1.06 | 0.98 | 1.07 | 1 | 0.99 |
| Humidity 2 | 1 | 1.03 | 1.05 | 1.05 | 1.06 | 1 | 1 | 1.08 |
| Humidity 3 | 1.03 | 1 | 0.97 | 1.06 | 1 | 1.06 | 1.02 | 1 |

| Operation condition | W31 | W32 | W33 | W34 | W41 | W42 | W43 | W44 |
|---|---|---|---|---|---|---|---|---|
| AM | 1.07 | 1.06 | 1.02 | 1.04 | 1 | 1.06 | 1.06 | 1.05 |
| FM | 0.98 | 1 | 1.05 | 1.05 | 1.06 | 1.07 | 1.02 | 0.99 |
| PM | 1.05 | 1.05 | 1.04 | 0.97 | 1.07 | 1.02 | 1.04 | 1.04 |
| Freq. band 1 | 1 | 1.04 | 1.06 | 1.05 | 0.98 | 1.06 | 0.98 | 1.05 |
| Freq. band 2 | 1.07 | 1 | 1.04 | 1.07 | 1.07 | 1 | 1.03 | 1 |
| Freq. band 3 | 1.05 | 0.97 | 0.98 | 0.99 | 0.99 | 1.02 | 1 | 1.05 |
| Output power level 1 | 1 | 1.07 | 1 | 1 | 1 | 0.97 | 1.05 | 0.99 |
| Output power level 2 | 1.04 | 1.05 | 0.99 | 1.07 | 1.02 | 1.03 | 0.99 | 1 |
| Output power level 3 | 0.98 | 1.04 | 1.03 | 1.05 | 1.05 | 1 | 1 | 1 |
| Magnetic field condition 1 | 1.03 | 1.04 | 1.07 | 0.97 | 1.07 | 1.05 | 1.05 | 0.99 |
| Magnetic field condition 2 | 1 | 0.98 | 1.04 | 1.03 | 1.04 | 0.99 | 1.07 | 1.07 |
| Magnetic field condition 3 | 1.04 | 1.07 | 1.05 | 0.99 | 1 | 1 | 1 | 1.04 |

TABLE 1-continued

| Humidity 1 | 1.05 | 1.05 | 1.07 | 1.05 | 1.03 | 1.04 | 1.07 | 1.05 |
|---|---|---|---|---|---|---|---|---|
| Humidity 2 | 1.04 | 1.07 | 0.98 | 1 | 1.05 | 1.07 | 1.05 | 1.04 |
| Humidity 1 | 1 | 1.04 | 1 | 0.99 | 1.04 | 1.05 | 1 | 1.07 |

As described in a LUT of Table 1 or Table 2, the LUT 50 stores the tuning value for the optimum output of the power signals subjected to the operation purpose of each spin modulator according to the kind of the modulation operation and the operation condition of spin modulators. The LUT is the result of the optimum value obtained from several measurements.

TABLE 2

| dat3 | operating condition | dat3 | operating condition |
|---|---|---|---|
| 000 . . . 00 | AM | 000 . . . 00 | AM2 |
| 000 . . . 01 | FM | 000 . . . 01 | FM2 |
| 000 . . . 10 | PM | 000 . . . 10 | PM2 |
| 000 . . . 11 | Freq. band 1 | 000 . . . 11 | Freq. band 4 |
| . . . | Freq. band 2 | . . . | Freq. band 5 |
| . . . | Freq. band 3 | . . . | Freq. band 6 |
| . . . | Output power level 1 | . . . | Output power level 4 |
| . . . | Output power level 2 | . . . | Output power level 5 |
| . . . | Output power level 3 | . . . | Output power level 6 |
| . . . | Magnetic field condition 1 | . . . | Magnetic field condition 4 |
| . . . | Magnetic field condition 2 | . . . | Magnetic field condition 5 |
| 111 . . . 00 | Magnetic field condition 3 | 111 . . . 00 | Magnetic field condition 6 |
| 111 . . . 01 | Humidity 1 | 111 . . . 01 | Humidity 4 |
| 111 . . . 10 | Humidity 2 | 111 . . . 10 | Humidity 5 |
| 111 . . . 11 | Humidity 3 | 111 . . . 11 | Humidity 6 |

Figure 3:
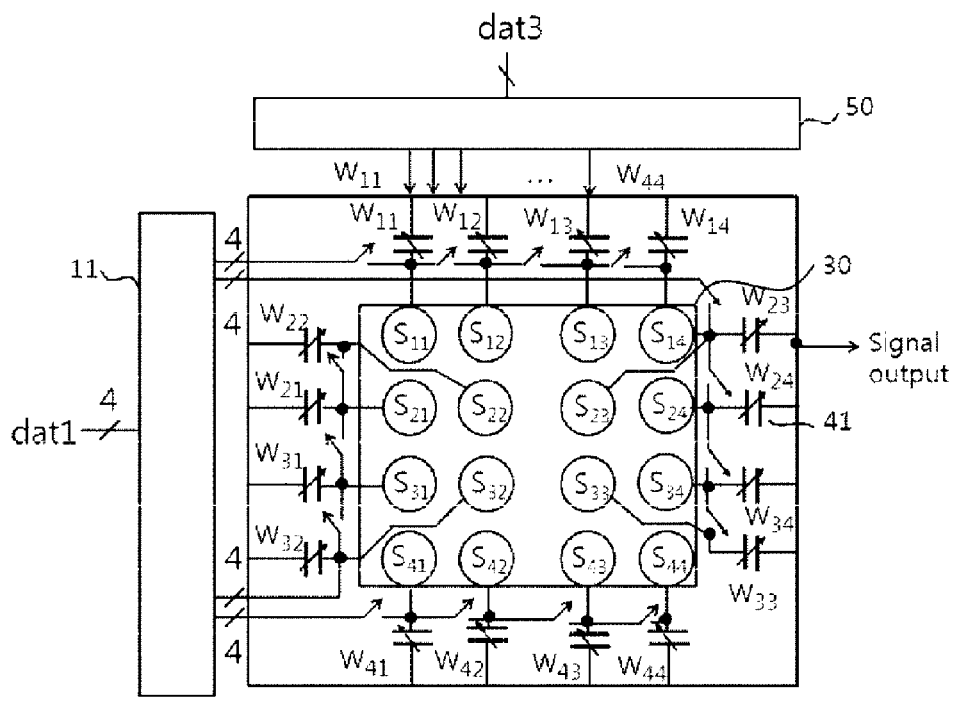
FIG. 3 illustrates an embodiment of 4×4 matrix spin modulators described in FIG. 2.

FIG. 3, as an embodiment of a spin modulator described in FIG. 2, illustrates the design that uses a decoder 11 as a selection control means 10, 4×4 matrix oscillators as a spin array 30, and a variable capacitor array 41 as a phase tuning array 40. One of connectors of the variable capacitor 41 is connected commonly to each other to generate a single oscillation signal. The capacitance of the variable capacitor 41 is determined by applying the tuning value ($W_{11}$, $W_{12}$ . . . $W_{44}$, or . . . $W_{mn}C$ . . . $W_{mn}F$) from the LUT 50.

FIG. 4 illustrates a detailed configuration of a spin modulator which has a variable capacitor and a variable current source as described in FIG. 2 or FIG. 3. The spin modulator includes a transistor (T1), a variable current source 21, an inductor (L1), a variable capacitor 41, and a spin oscillator 31.

The gate of a transistor (T1) is connected to the output connector of a decoder 11 as output signals ($En_{11}$~$E_{mn}$) of a selection control means, and a drain is connected to a voltage source terminal (VDD), and a source is connected to a variable current source 21. The variable current source 21 might be controlled by the second control signal (dat2) which could be analog values. One side of an inductor (L1) is connected to a variable current source 21 and the other side of an inductor is connected to one side of a spin oscillator 31. The one side of the spin oscillator 31 is also connected to one side of the variable capacitor 41. The other side of the variable capacitor is connected to earth line and generates the output of oscillation signals. The current from the variable current source is applied to the spin oscillator 31. The capacitance of the variable capacitor 41 is tuned for having the optimum phase synchronization operation characteristics with near the spin oscillator 31 by applying the tuning values from the LUT 50 as voltage values to the variable capacitor 41.

Figure 1:
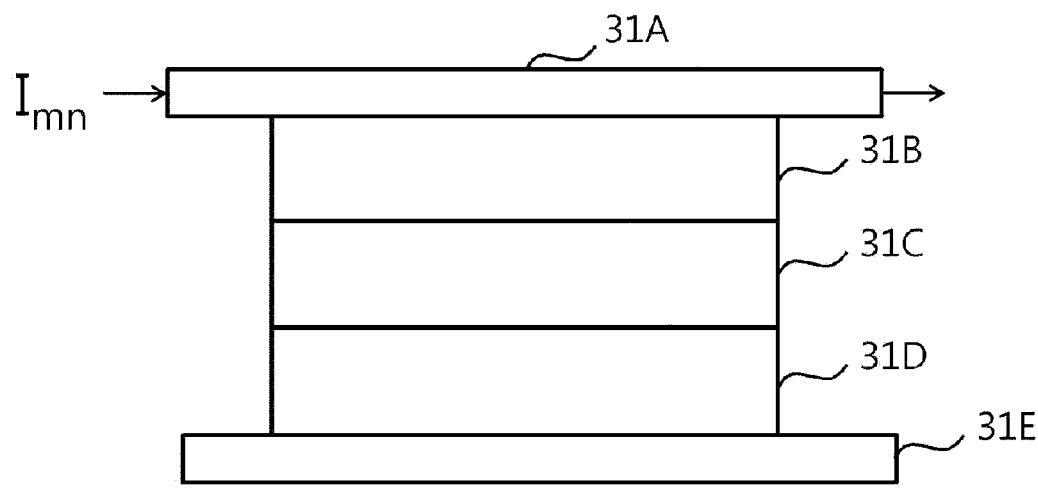
FIG. 1 illustrates a cross sectional view of a spin oscillator according to the present invention.

A spin oscillator 31 is implanted using a spin device of a nano-pillar structure as illustrated in FIG. 1 and the nano-pillar structure has the stack structure which includes the first conducting layer 31A, a free magnetic layer 31B, a nonmagnetic layer 31C, a fixed magnetic layer 31D, and the second conducting layer 31E. A free magnetic layer 31B is made of soft magnetic material which is easy to change the direction of electron spins by applying external magnetic field. A nonmagnetic layer 31C is made of nonmagnetic metal or very thin insulator. A fixed magnetic layer 31D is made of ferromagnetic material which is not easy to change the direction of electron spins by applying external magnetic field. The spin oscillator 31 which includes an insulator material as a nonmagnetic layer 31C becomes tunneling magneto-resistance (TMR) structure and the spin oscillator 31 which includes a conductor material as a nonmagnetic layer 31C becomes giant magneto-resistance (GMR) structure. A free magnetic layer might use the layer of magnetic domain wall or magnetic vortex. A spin oscillator according to the present invention is not limit to the structure as described in FIG. 1 and can be implanted using a spin oscillator of different structures.

Figure 5:
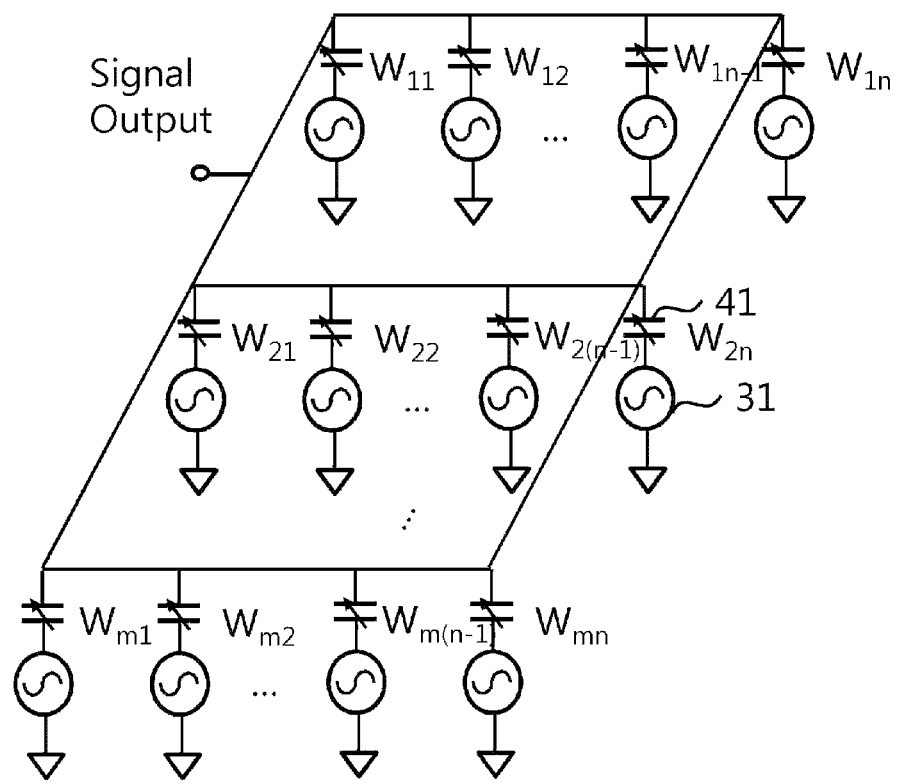
FIG. 5 illustrates a circuit diagram which connects an m×n variable capacitor array to m×n spin oscillators.

FIG. 5 illustrates m×n matrix spin oscillators which are connected to variable capacitors with 1:1 correspondence. The spin oscillator which generates the oscillation signal of high output power includes each detailed configuration as described in FIG. 4 and one side of each variable capacitor 41 is connected each other and the other side of each variable capacitor is connected to each spin oscillator.

Figure 9:
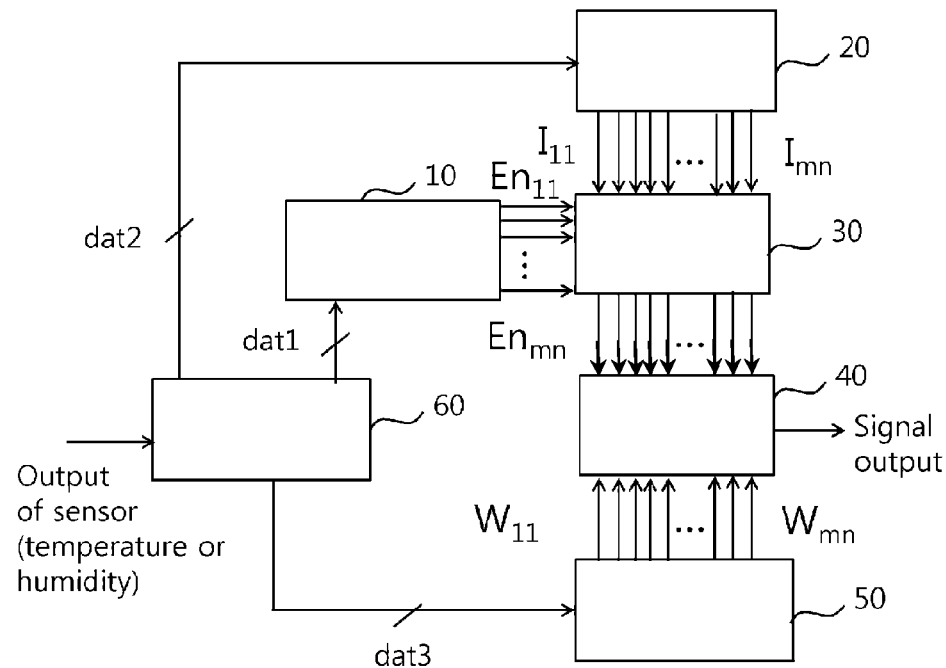
FIG. 9 illustrates a block diagram of a spin modulator having phase tuning means according to the present invention.

A spin oscillator in FIG. 9 has a difference with that of FIG. 2. The difference is to select directly a spin array from a selection control means 10 and to provide the power to the spin array 30 by controlling the controller 60 as a power supply means 20.

The manufacturing method of the spin modulator according to the present invention is as follows. A spin modulator which includes spin oscillators and a phase tuning means is manufactured using CMOS process. Each spin oscillator is tested for each operation condition and the optimum measured values are stored to a LUT 50. Each variable capacitor is tested for each operation condition and the optimum measured values are stored to a LUT 50. Coarse optimum values or fine optimum values of the variable capacitor according to operation conditions are stored in the LUT 50.

Embodiment 1

Figure 6:
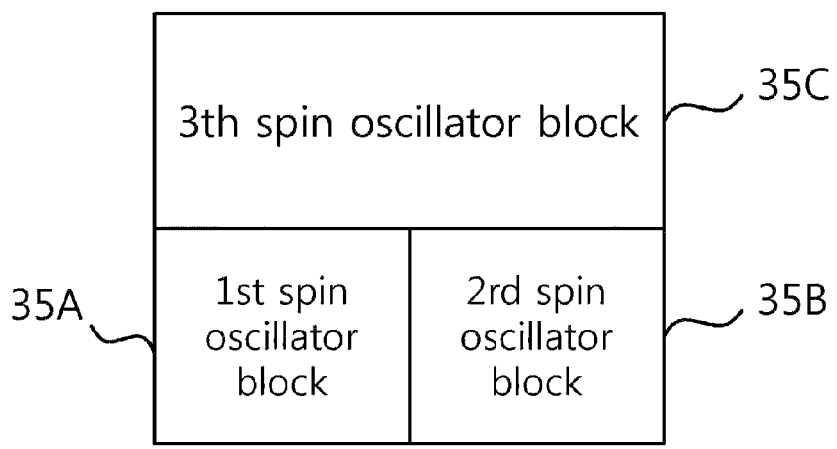
FIG. 6 illustrates a conceptual diagram of an example which divides a spin array to according to the multi-symbol amplitude modulation method.

For an embodiment according to the present invention, the multi-symbol amplitude modulation method is descried using FIG. 6 as follows. The method is an amplitude modulation which transmits multi-symbol amplitude modulation multi-bit as single symbol. It means that m-symbol amplitude modulations need the output power levels of $2^m$.

To obtain 2-symbol amplitude modulation signal from a spin modulator, for example, the spin array are divided to the first spin oscillator block 35A, the second spin oscillator block 35B, and the third spin oscillator block 35C. It means that to obtain 2-symbol amplitude modulation signal needs $2^2=4$ different amplitude signals. For example, in the case of amplitude modulation "00" data, since the decoder 11 turns off all spin oscillators, the first level amplitude modulation signal of almost 0 is outputted. In the case of amplitude modulation "01" data, the decoder 11 turns on spin oscillators which belong the first spin oscillator block 35A and the second level amplitude modulation signal is obtained. The selection control means 10 and the decoder 11 are tuned for the operation of only spin oscillators located at left and bottom side in FIG. 6. In the case of amplitude modulation "10" data, spin oscillators consisting of the first spin oscillator block 35A and the second spin oscillator block 35B are operated to get the third level amplitude modulation signal. The decoder 11, for example, is tuned for the operation of spin oscillators located at left and right bottom in FIG. 6. The amplitude of the third level amplitude modulation signal is bigger than that of the second level amplitude modulation signal. In the case of amplitude modulation "11" data, decoder 11 operates the first spin oscillator block 35A, the second spin oscillator block 35B, and the third spin oscillator block 35C to get the fourth level amplitude modulation signal, which means the operation of all spin oscillators. The amplitude of the third level amplitude modulation signal is bigger than that of the fourth level amplitude modulation signal. Spin array 30 using 2 bits data generates 2-symbols amplitude signals of 4 levels. Modulation frequencies are identical. Currents or tuning values which are applied to spin array are controlled for the optimum output signal generation according to change of operation circumstance. The numbers of spin oscillators are adjusted according to operation condition in the optimum tuning.

As the same principle which transmits 2 bits data as single symbol, z-symbol amplitude modulation can be implanted by transmitting z bit that is integer greater than or equal to 1 as single symbol. The entire spin oscillator blocks are divided to spin oscillator blocks of $2^z-1$. The lowest level signal is a signal which is generated under the entire spin oscillators off condition. Each amplitude level of output signals increases with increasing the additional operation of spin oscillator blocks. In the case of amplitude modulation, each spin oscillator is set to each applying current and the capacitance of variable capacitors of all spin oscillators (or part of all oscillators) is tuned for the generation of modulation signal with the optimum output signal characteristics. Decoder 11 can be used selectively to obtain the final amplitude modulation signal according to modulation signal such as voice, video, or data.

Embodiment 2

For an embodiment according to the present invention, referring FIG. 7, a multi-symbol frequency modulation method is described as follows.

For example, a 2-symbol frequency modulation outputs different frequencies of the number of $4(2^2)$ to every the first spin oscillator block 33A, the second spin oscillator block 33B, the third spin oscillator block 33C, and the fourth spin oscillator block 33D. 2 bits symbol modulations are performed as follows. In case of the frequency modulation of "00" data, the first frequency modulation signal is outputted by operating spin oscillators which are deployed in the first spin oscillator block 33A of the spin array 30. In case of the frequency modulation of "01" data, the second frequency modulation signal is outputted by operating spin oscillators which are deployed in the second spin oscillator block 33B of the spin array 30. In case of the frequency modulation of "10" data, the third frequency modulation signal is outputted by operating spin oscillators which are deployed in the third spin oscillator block 33C of the spin array 30. In case of the frequency modulation of "11" data, the fourth frequency modulation signal is outputted by operating spin oscillators which are deployed in the fourth second spin oscillator block 33D of the spin array 30. Each spin oscillator block can change the magnitude of applying current or vary the capacitance value of phase tuning means from the LUT for generating the signals of different frequencies. Or both means can be applied.

In case of multi-symbol frequency modulations, the first step of a dividing method of plural spin oscillator blocks is to allocate each spin oscillator block by the measurement results according to the frequency characteristics of each spin oscillator. The second step is to select each spin oscillator block which has the minimum value of signal line width obtained from phase synchronization operation of each frequency variable capacitor. Or the plural spin oscillator blocks are divided by considering both steps for the minimum value of signal line width. The third step is to adjust the number of spin oscillators for the equal phase level of the spin oscillator block at each frequency.

Figure 7:
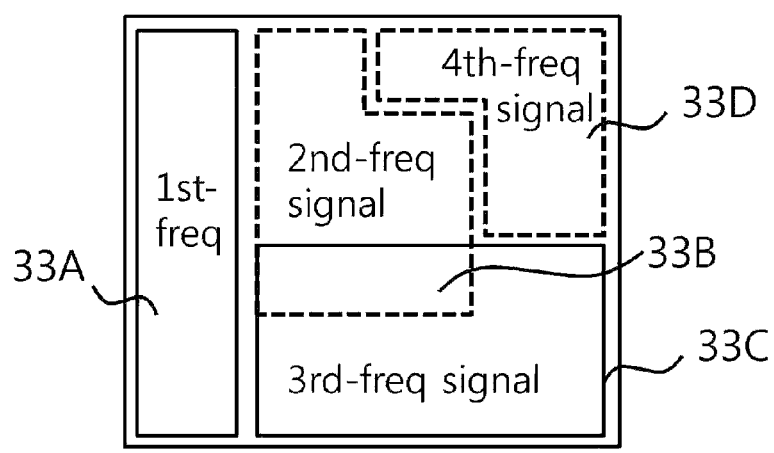
FIG. 7 illustrates a conceptual diagram of an example which divides a spin array to according to the multi-symbol frequency modulation method

As described in FIG. 7, a spin oscillator block according to each frequency has asymmetric structure or the repetition use of spin oscillators in each spin oscillator block.

As explained before, 2-symbol frequency modulation method can expand x-bit where x is integer greater than or equal to 1 to x-symbol frequency modulation as transmitting single symbol according to channel environments. By dividing spin array to $2^x$ spin oscillator blocks and applying different powers to each oscillator block, modulation signals which has different frequencies are outputted.

Embodiment 3

Figure 8:
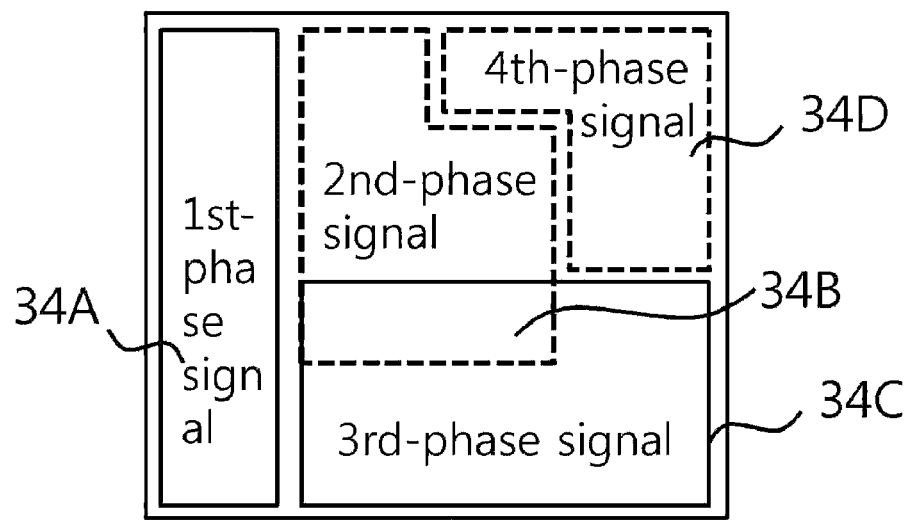
FIG. 8 illustrates a conceptual diagram of an example which divides s spin array to according to the multi-symbol phase modulation method

For an embodiment according to the present invention, referring FIG. 8, a multi-symbol frequency modulation method is described as follows.

The spin array are divided to the first spin oscillator block 33A, the second spin oscillator block 33B, the third spin oscillator block 33C, and the fourth second spin oscillator block 33D. In case of the phase modulation of "00" data, the first phase modulation signal is outputted by operating spin oscillators which are deployed in the first spin oscillator block 33A of the spin array 30. In case of the phase modulation of "01" data, the second phase modulation signal is outputted by operating spin oscillators which are deployed in the second spin oscillator block 33B of the spin array 30. In case of the phase modulation of "10" data, the third phase modulation signal is outputted by operating spin oscillators which are deployed in the third spin oscillator block 33C of the spin array 30. In case of the phase modulation of "11" data, the fourth phase modulation signal is outputted by operating spin oscillators which are deployed in the fourth second spin oscillator block 33D of the spin array 30. Even if the spin array which is described in FIG. 8 is determined as m×n spin array structure and 2-symbol phase modulation, the spin array can be y-bit where y is integer greater than or equal to 1 to y-symbol phase modulation as transferring single symbol. By dividing spin array to $2^y$ spin oscillator blocks and applying different powers or tuning values to each oscillator block, modulation signals which has different phases are outputted.

According to the present invention, in order to synchronize the phases of the spin array 30 structure at the optimum conditions, variable capacitors are connected to spin array 30 and applied tuning values to them to synchronize the phases of spin oscillators each other. Each spin oscillator block varies the magnitude of applying current or changes the capacitance of phase tuning means from a LUT for the outputs with different phase signals.

The combination of spin array with a variable capacitor can do a multi-symbol amplitude modulation, a multi-symbol frequency modulation, and a multi-symbol phase modulation in the optimum condition. The low power consumption and high data rate of gaga bit rate are realized by multi-kind modulations according to the present invention.

The present invention solves the problems of the prior art spin oscillator which has fluctuations due to manufacturing process variations, and which has low power and high phase noise by using the variable capacitor and the LUT 50 which stores the tuning values for the optimum output power to synchronize the phases of spin oscillators to single phase. The present invention provides the stable operation of the spin oscillator by considering the operation condition of array type oscillators which is varied with surrounding circumstance. Thus, the present invention provides oscillation signal of carrier wave superior to that of prior art VCO, and provides the oscillation and the modulation signals superior to that of prior art's spin oscillator in the output power level and the phase noise, and the narrow line width.

INDUSTRIAL APPLICABILITY

The present invention as a nanosize spin modulator can apply to a very small and high speed oscillator, a modulator and a transceiver.

What is claimed is:

1. A spin modulator having a phase tuning means, comprising:
   a spin array including m×n matrix spin-transfer torque oscillators where m and n are integer greater than 1;
   a selection control means configured to selectively operate the spin-transfer torque oscillators according to a modulation of input data;
   a phase tuning array including m×n matrix phase tuning means for one-to-one (1:1) pairing with the spin-transfer torque oscillators to synchronize a phase of an output signal of each of the spin-transfer torque oscillators, the synchronization being performed by applying tuning values according to an operational condition; and
   a lookup table which stores the tuning values which are applied to each of the m×n matrix phase tuning means for an output power of the spin-transfer torque oscillators according to the operational condition,
   wherein the m×n matrix phase tuning means are connected to the spin-transfer torque oscillators with 1:1 pairs and the m×n matrix phase tuning means are variable capacitors which vary capacitance according to the tuning values from the lookup table.

2. The spin modulator of claim 1, further comprising a power supply means which supplies a power to the m×n matrix spin-transfer torque oscillators by switching of the selection control means.

3. The spin modulator of claim 2, wherein the power supply means includes variable current sources which control a magnitude of current according to the operational condition and adjust output signals of the spin-transfer torque oscillators.

4. The spin modulator of claim 1, further comprising a control unit which controls the selection control means and the lookup table according to the operational condition.

5. A spin oscillator with a phase tuning array, comprising:
   a spin array including m×n matrix spin-transfer torque oscillators where m and n are integer greater than 1;
   a power supply means configured to apply power to the spin-transfer torque oscillators;
   a phase tuning array including m×n matrix phase tuning means to synchronize the spin-transfer torque oscillators each other; and a lookup table configured to store tuning values which are selectively applied to the phase tuning array for a maximum output power of the spin-transfer torque oscillators according to an operational condition, wherein the phase tuning array consists of variable capacitors which are connected to the spin-transfer torque oscillators with 1:1 pairs.

* * * * *